United States Patent
Goerrn

(10) Patent No.: US 10,558,027 B2
(45) Date of Patent: Feb. 11, 2020

(54) METHOD OF CONCENTRATING LIGHT AND LIGHT CONCENTRATOR

(71) Applicant: BERGISCHE UNIVERSITAET WUPPERTAL, Wuppertal (DE)

(72) Inventor: Patrick Goerrn, Wuppertal (DE)

(73) Assignee: BERGISCHE UNIVERSITAET WUPPERTAL, Wuppertal (DE)

( * ) Notice: Subject to any disclaimer, the term of this patent is extended or adjusted under 35 U.S.C. 154(b) by 0 days.

(21) Appl. No.: 15/303,318

(22) PCT Filed: Jul. 2, 2014

(86) PCT No.: PCT/EP2014/001809
§ 371 (c)(1),
(2) Date: Oct. 11, 2016

(87) PCT Pub. No.: WO2016/000728
PCT Pub. Date: Jan. 7, 2016

(65) Prior Publication Data
US 2017/0168277 A1    Jun. 15, 2017

(51) Int. Cl.
*G02B 19/00* (2006.01)
*G02B 6/122* (2006.01)
(Continued)

(52) U.S. Cl.
CPC ......... *G02B 19/0042* (2013.01); *G02B 5/008* (2013.01); *G02B 5/1809* (2013.01);
(Continued)

(58) Field of Classification Search
CPC ...... G02B 6/1226; G02B 6/122; G02B 6/124; G02B 6/132; G02B 2006/12119;
(Continued)

(56) References Cited

U.S. PATENT DOCUMENTS

2005/0013541 A1    1/2005  Kittaka
2007/0153867 A1    7/2007  Muller
(Continued)

OTHER PUBLICATIONS

Refractive-index sensor based on long-range surface plasmon mode excitation with long-period waveguide grating—Q. Liu and K. S. Chiang (Year: 2009).*

(Continued)

*Primary Examiner* — Eric Wong
*Assistant Examiner* — Mary A El-Shammaa
(74) *Attorney, Agent, or Firm* — Andrew Wilford

(57) ABSTRACT

The invention relates to a method for concentrating light by coupling light into a thin film waveguide (2, 4) arranged on a substrate (1), in particular via at least one of its parallel surfaces, the method further comprising the step of exciting in the thin-film-waveguide (2, 4) at least one lateral guided mode (5) having at least one node (6), preferably exactly one node (6), by interaction, in particular scattering, diffraction or surface plasmon excitation of the incident light with a nanopatterned discontinuous excitation layer (3) of material, in particular metal, preferably silver, the nanopatterned discontinuous excitation layer (3) being arranged in the thin-film-waveguide (2,4) at the position of the at least one node (6) of the guided lateral mode (5). The invention furthermore relates to alight concentrator comprising a thin film waveguide (2, 4) deposited on a substrate (1), the thin film waveguide (2, 4) having at least two parallel surfaces, light being coupable into the thin film waveguide (2, 4) via at least one of these surfaces, wherein the thin film waveguide (2, 4) is established as a collecting thin film waveguide (2, 3, 4) for collecting light by arranging a nanopatterned discontinuous excitation layer (3) of material, in particular of metal and preferably of silver at a position corresponding to the node position (6) of a guided mode (5) to be excited in (Continued)

the collecting thin film waveguide (2, 3, 4). The invention also relates to a method of fabricating such a light concentrator.

16 Claims, 4 Drawing Sheets

(51) Int. Cl.
*G02B 5/18* (2006.01)
*G02B 5/00* (2006.01)
*H01L 31/054* (2014.01)
*H02S 40/22* (2014.01)
*G02B 6/124* (2006.01)
*G02B 6/132* (2006.01)
*H01L 31/0232* (2014.01)
*B82Y 20/00* (2011.01)
*G02B 6/12* (2006.01)

(52) U.S. Cl.
CPC ............. *G02B 6/122* (2013.01); *G02B 6/124* (2013.01); *G02B 6/1226* (2013.01); *G02B 6/132* (2013.01); *G02B 19/0009* (2013.01); *H01L 31/02325* (2013.01); *H01L 31/0543* (2014.12); *H02S 40/22* (2014.12); *B82Y 20/00* (2013.01); *G02B 2006/12107* (2013.01); *G02B 2006/12119* (2013.01); *G02B 2207/101* (2013.01); *Y02E 10/52* (2013.01)

(58) Field of Classification Search
CPC ............ G02B 19/0009; G02B 19/0042; G02B 2207/101; H01L 31/02325; H02S 40/22
See application file for complete search history.

(56) References Cited

U.S. PATENT DOCUMENTS

| | | | |
|---|---|---|---|
| 2008/0084597 A1* | 4/2008 | Hamada | G02F 1/011 359/237 |
| 2008/0236652 A1 | 10/2008 | Defries | |
| 2008/0266567 A1* | 10/2008 | Skorobogatiy | B82Y 20/00 356/445 |
| 2009/0110021 A1* | 4/2009 | Conway | H01S 5/18 372/102 |
| 2009/0253227 A1* | 10/2009 | Defries | H01L 31/02168 438/72 |
| 2010/0108133 A1 | 5/2010 | Bhagavatula | |
| 2010/0203454 A1* | 8/2010 | Brongersma | C23C 14/06 430/311 |
| 2010/0229943 A1* | 9/2010 | Ji | B82Y 20/00 136/257 |
| 2010/0236625 A1 | 9/2010 | Kenney | |
| 2010/0307553 A1* | 12/2010 | Defries | B82Y 20/00 136/243 |
| 2011/0170822 A1* | 7/2011 | Avrutsky | B82Y 20/00 385/11 |
| 2011/0235478 A1* | 9/2011 | Komura | G11B 5/3116 369/13.24 |
| 2012/0287429 A1* | 11/2012 | Van Dorpe | B82Y 10/00 356/301 |
| 2014/0175407 A1 | 6/2014 | Pschenitzka | |
| 2014/0185640 A1* | 7/2014 | Jain | B82Y 20/00 372/45.011 |
| 2014/0358128 A1* | 12/2014 | Montazeri | H01L 31/054 604/890.1 |
| 2015/0168392 A1* | 6/2015 | Van Dorpe | G01N 33/54373 435/5 |
| 2017/0168277 A1* | 6/2017 | Goerrn | G02B 19/0042 |

OTHER PUBLICATIONS

Valery N. Konopsky and Elena V. Alieva, Long-Range Propagation of Plasmon Polaritons in a Thin Metal Film on a One-Dimesional Photonic Crystal Surface, Institute of Spectroscopy, Russian Academy of Sciences, troitsk, Moscow Region, 142190, Russia (Received Aug. 1, 2006, published Dec. 22, 2006).

* cited by examiner a...f: possible nanopatterns for the collection areas g: vectorised SEM image of transfer printed SIF gating

METHOD OF CONCENTRATING LIGHT AND LIGHT CONCENTRATOR

CROSS REFERENCE TO RELATED APPLICATIONS

This application is the US-national stage of PCT application PCT/EP2014/001809 filed 2 Jul. 2014 and claiming the priority of PCT patent application PCT/EP2014/001809 itself filed 2 Jul. 2014.

FIELD OF THE INVENTION

The invention relates to a method for concentrating light by coupling light into a thin film waveguide, in particular via at least one of its parallel surfaces. The invention furthermore relates to a light concentrator, a method for fabricating such a light concentrator and the use of such a light concentrator.

BACKGROUND OF THE INVENTION

The mentioned parallel surfaces are understood as the surfaces of the waveguide also being parallel to the surface of the substrate to which the thin film waveguide is arranged. These parallel surfaces of the thin film waveguide form interfaces between the waveguide and air or a capping and between the waveguide and the substrate.

Concentrating light in the context of the invention happens at least by collecting light using a thin film waveguide having two parallel surfaces for coupling light into the thin film waveguide through at least one of these surfaces.

A dielectric thin film waveguide as known in the art is typically arranged, preferably by material deposition, as a stack of transparent thin films of an overall thickness of 300 nm to 1 pm or only a few pm on a supporting substrate. One surface of the thin film waveguide contacts the substrate. One other surface of the thin film waveguide contacts the surrounding air or a capping. At least one of these two parallel surfaces forms a surface of incidence through which light may be coupled into the thin film waveguide.

With the thin film waveguide thickness in the range of a few hundred nanometers to a few micrometers only and the diameter of a propagating mode being in the same order the collecting area at the surface of the thin film waveguide will typically exceed the cross section of the excited waveguide modes.

In that sense the collection of light into guided modes means concentrating the light, particularly in a first step.

In a possible second step termed planar concentration the guided modes may be further concentrated, for instance by reducing the waveguides cross section, particularly the width and/or tapering it into stripe waveguides, which further reduces the modal cross section.

Propagation of a guided mode in the thin film waveguide takes place—if not restricted to one specific direction or several specific directions by other means—in all directions being parallel to the surface of the thin film waveguide and perpendicular to the normal vector of the substrate surface. These directions are understood as lateral. Accordingly the excited guide modes are also named as lateral modes.

Collecting light through the surface of the thin film waveguide may take place in any direction that leads to a refraction of the light incident to the surface into the volume of the thin film waveguide.

In a perfectly planar passive dielectric thin film waveguide with smooth parallel surfaces an excitation of guided lateral modes from the outside through one of these surfaces is impossible (Snell's law). In fact this can be accomplished by braking the planarity with refractive index variations, backside scattering or diffractive elements. However, these concepts suffer from a symmetry between excitation and extraction of guided waveguide modes. In other words in the state-of-the-art passive planar thin film waveguides all measures taken to enable coupling light into the waveguide via at least one of its surfaces also lead to improved extraction of the trapped light through the same surface. Accordingly only a small amount of the trapped light is guided in the thin film waveguide, for example by the principle of total reflection in a film mode excited in the waveguide.

The state of the art luminescent solar concentrators (LSCs) overcome this disadvantage of passive waveguides. In such "active" concentrators photons being coupled into the waveguide are absorbed in a specific range of wavelength by means of a luminescent waveguide medium and emitted by the principle of luminescence into planar waveguide modes at a longer wavelength. Accordingly in principle the method of coupling light into the waveguide by absorption and emission does not affect the traveling of the emitted waveguide modes due to the different wavelength and the stokes-shift of absorption and emission spectrum of the used medium.

Typically such luminescent waveguides are plates of a few millimeters in thickness that have two parallel surfaces being spaced by their edge surfaces that connect the two parallel surfaces in the direction of their respective normal vectors. The spacing/distance between the two parallel surfaces is small (typically at least 10 times smaller) compared to the extension of the collecting area in both dimensions. The sum of all edge surface areas that may be used for extraction (extraction area) of the concentrated light is less than the thin film waveguide surface area used for coupling light into the waveguide (collection area).

Solar cells may be arranged at these edges of such an LSC to convert the guided light energy into electricity. The concentration factor of LSCs, defined as the ratio of the collection area to the extraction area is typically limited to about 10. This is firstly due to the large thickness of the waveguide and secondly due to the collecting area that is typically limited to tens of square centimeters. Larger collecting areas lead to decreased optical efficiency (extracted concentrated optical power to incident optical power) due to propagation losses of the waveguide modes. Because of the limited area of a single LSC the coverage of significant areas in the range of square meters requires extensive electrical wiring which further increases the complexity and cost of such systems.

OBJECTS OF THE INVENTION

In view of these facts it is an object of the invention to provide a method for concentrating light and a passive light concentrator being capable to overcome the known disadvantages.

Particularly the method and a concentrator shall make use of a principle of coupling light into a thin film waveguide that does in turn scarcely affect the propagation of excited modes traveling in the waveguide in a lateral direction.

SUMMARY OF THE INVENTION

According to the invention this object is attained by a method as mentioned, further comprising the step of exciting in the thin film waveguide at least one guided (film-)

mode having at least one node, preferably exactly one node, by interaction of the incident light with a nanopatterned discontinuous excitation layer being arranged in the thin film waveguide at a position of the at least one node of the guided lateral mode. A thin film waveguide having such an incorporated nanopatterned discontinuous excitation layer is termed collecting thin film waveguide. The nanopatterned discontinuous excitation layer is preferably arranged only in the node(s) position of the guided mode.

The term "node" is understood as a minimum of intensity in the intensity profile of the excited mode within the waveguide. The intensity profile for determining the node position is in this case regarded in the direction(s) of mode confinement. In case of a thin film waveguide that is extended over both lateral dimensions this means the direction of the normal vector of the light collecting surface only. For a stripe shaped thin film waveguide this may include the confined lateral direction as well. Accordingly a position of such a node is at least somewhere between the two parallel surfaces of the waveguide regarded in the direction of the normal vector of these surfaces. The mentioned nanopatterned excitation layer is discontinuous at least in the direction of propagation of the excited mode, in particular it may be discontinuous in all lateral directions.

Instead of a planar waveguide of millimeters in thickness a thin film waveguide for collecting light is used in the concentrator according to the invention. This collecting thin film waveguide consists of one or more transparent, particularly dielectric layers with refractive index higher than the substrate, the nanopatterned discontinuous excitation layer and the capping, e.g. air. The waveguide modes are confined to the collecting thin film waveguide or stack of several (at least two) collecting thin film waveguides with thickness of about 300 nm to 1 μm each. Due to the small thickness the material consumption is small and, more importantly flexible light concentrators can be envisaged.

A nanopatterned discontinuous excitation layer as understood by the invention breaks the planarity of the collecting thin film waveguide and enables a change of the propagation direction of the incident light, particularly by means of scattering, diffraction or plasmon excitation. This way the nanopatterns of the discontinuous excitation layer defining spaces, in particular with dimensions of a fraction of the wavelength may generate from the incident light a laterally propagating (film-) mode. As a consequence such a nanopatterned discontinuous excitation layer of the collecting thin film waveguide is a measure to enable coupling of light into the light concentrator.

Due to the arrangement of the nanopatterned discontinuous excitation layer in a position of a node of a film mode having at least one node high propagation losses exist for the fundamental mode. This is because the fundamental mode significantly interacts with the nanopatterned discontinuous excitation layer. It is well known that the propagation losses in waveguides containing low loss and lossy waveguide modes are largely determined by the low loss modes. Hence the high losses of the fundamental mode will not have any negative impact on the light concentrator performance.

Only higher modes having their node(s) in the position(s) of the nanopatterned discontinuous excitation layer determine the light concentrator performance. A higher mode (TEn, TMn, with n>=1) excited by the nanopatterned discontinuous excitation layer does scarcely interact with that nanopattern when traveling in the waveguide since no significant intensity of light exists at the position of the nanopattern. The invention thus provides that the excited mode in the collecting thin film waveguide is not affected by the coupling mechanism that serves to couple the light into the collecting thin film waveguide. It could be summarized that in a similar way as LSCs provide an energetic separation of incident light and guided modes the method of the invention provides a spatial separation. In other words, incident light interacts with the nanopatterned discontinuous excitation layer that stays "invisible" for the guided modes.

The material of the transparent continuous layers of the collecting thin film waveguide that surround the nanopatterned discontinuous excitation layer may be chosen from any transparent material suitable to guide light, in particular a transparent dielectric material of larger refractive index compared to the substrate. The nanopatterned discontinuous excitation layer that is arranged in the collecting thin film waveguide at the position of a node, in particular the node of the first higher transverse mode (TE-i, TM-i) may also be chosen from any suitable material that shows a strong interaction with visible light at a very low mass thickness of the nanopatterned discontinuous excitation layer typically below 20 nm. This way the excitation layer fits into the node and serves to excite at least one low loss lateral mode by interaction with the incident light, in particular by exciting SPPs. Such a material may be a metal, preferably silver.

The aforementioned object of the invention in addition is solved by a light concentrator comprising a thin film waveguide having two parallel surfaces, light being couplable into the thin film waveguide via at least one of these surfaces, the thin film waveguide being established as a light collecting thin film waveguide for collecting light by arranging a nanopatterned discontinuous excitation layer of material, in particular of metal and preferably of silver at a position corresponding to a node position of a guided mode to be excited in the collecting thin film waveguide, this mode having at least one node. The collecting thin film waveguide in the light concentrator may have planar or even bent surfaces.

Also here it is the understanding of the invention that a nanopatterned discontinuous excitation layer does not constitute a continuously closed area of material but only a discontinuous area having space between the material in the range of nanometers, in particular less than 100 nm, preferably less than 10 nm.

In the collecting thin film waveguide which may form at least at part of a light concentrator the nanopatterned discontinuous excitation layer is at least restricted in a direction parallel to the normal vector of the collecting surface to the node position and particularly may extended over the entire area of the collecting thin film waveguide (collection area). The nanopatterned excitation layer thus forms an area of discontinuous material in a plane being parallel to the collection area. The collection area is not necessarily the entire area of the light concentrator, but at least a part, since the light concentrator may comprise waveguide structures in addition to the at least one collecting thin film waveguide.

A light concentrator according to the invention may also contain different collecting thin film waveguides with different nanopatterned discontinuous excitation layers or different dielectric layers or, in particular thin film waveguides having no nanopatterned discontinuous excitation layer at all. These waveguides may serve to only guide the light mode but no collection nor extraction takes place in such waveguides due to their continuous structure.

The material of the nanopatterned discontinuous excitation layer may be arranged as a film/layer in a plane parallel to the surfaces, in particular the film having a mass thickness in the direction of the normal vector of the surface(s) of 20 nm or less. Due to such a thickness restriction it is assured that the nanopatterned discontinuous excitation layer does not extent into positions of the guided film mode having significant intensity. The excitation layer should preferably not extend, particularly in the direction of the normal vector of the surfaces beyond positions of lmax/100, where lmax is the intensity maximum of the entire intensity profile.

One example for a self-organized nanopatterned discontinuous excitation layer in the collecting thin film waveguide of the light concentrator is a silver island film that is formed when silver is deposited in particular at a mass thickness below the percolation limit. In particular the silver island film may show a mass thickness of 5 to 15 nm and/or particle size of 10 to 100 nm. Such thickness or size provides that the film of material is discontinuous (islandized) and causes strong interaction with incident light and very low reflection compared to a continuous film.

Recent experiments have shown that a discontinuous silver island film (SIF) showing strong scattering of incident light enables propagation losses well below 1 $cm^{-1}$ for a lateral mode when aligned in its node position. It has to be kept in mind that silver shows an absorption of around 700.000 $cm^{-1}$ and that the silver island film of a mass thickness of 12 nm was placed in the center of a dielectric waveguide. These extremely low propagation losses found in this experiment hint to a hybridization of the dielectric node mode (TE-i) with the node perfectly aligned in the SIF with surface plasmon polaritons (SPPs) in the presence of the silver islands. The exact underlying mechanism is not yet fully understood. Importantly, a nanopatterned discontinuous excitation layer, for instance an SIF is put in a certain position of a dielectric thin film waveguide, thus forming a collecting thin film waveguide in accordance with the invention. In case the discontinuous excitation layer contains a metal like for instance silver the resulting collecting thin film waveguide is not purely dielectric anymore. It becomes at the same time a plasmonic waveguide, meaning a waveguide for SPPs. As both kinds of modes may hybridize the collecting thin film waveguide may also be considered a hybrid thin film waveguide. For simplicity reasons the waveguide will be termed thin film waveguide which includes all three cases. In the same way the excited lateral modes may be pure dielectric modes or SPPs or hybrids. They will be termed thin film modes which includes all three cases.

In order to form a light concentrator according to the invention the nanopatterned discontinuous excitation layer is preferably arranged between two layers of transparent, preferably transparent dielectric material. The two transparent layers may be made of the same material or of two different materials, in particular when using different material for the layers, the two layers may have different thickness in order to compensate the asymmetry of the excited transverse mode.

The collecting thin film waveguide of the light concentrator is optimized by means of a node position that is as independent from the wavelengths as possible. This way very low propagation losses can be reached in the entire visible light spectrum.

For the TE1/TM1 mode (or other odd-numbered modes) the perfect collecting thin film waveguide in that sense is a symmetric collecting thin film waveguide where the node position is in the very center. Such perfect symmetry may be established by identical upper and lower dielectric layer surrounding the nanopatterned discontinuous excitation layer and a capping on top of the upper dielectric layer with the same refractive index as the substrate contacting the lower dielectric layer, preferably the capping having a thickness>1 µm. In general the exact position of the expected node may be calculated in advance and the collecting thin film waveguide fabricated accordingly.

According to the method for concentrating light the light of the at least one laterally guided mode may be excited in at least one specific lateral direction by means of providing the nanopatterned discontinuous excitation layer with a scattering or diffracting structure. Such a structure does not need not to be necessarily periodic but serves to scatter or diffract the incident light predominantly in that at least one lateral direction.

For example such a structure may be a grating structure that may be periodic in that at least one lateral direction.

More than one specific lateral directions of propagation may be chosen. Consequently the structure may have several discontinuities causing scattering or diffracting effects or periodicities in different lateral directions. This helps exciting waves with a certain propagation direction and hence supports directing the modes to one or more specific positions in the waveguide, in particular to positions of extraction.

The nanostructure, in particular the grating structure in the collecting thin film waveguide of the concentrator according to the invention may have periodically arranged pattern elements, each pattern element may be formed of an islandized film of material, preferably silver. The pattern elements of the structure may also be formed from continuous films, preferably metal, particularly silver, as the diffracting or scattering structure itself also breaks planarity and allows scattering, diffraction and surface plasmon excitation.

For better handling and fabrication the light concentrator comprises a substrate, in particular a flexible foil, to which the collecting thin film waveguide is attached, in particular by material deposition.

A method for fabricating such a light concentrator may thus comprise the steps of depositing a first layer of a transparent, in particular dielectric material on a substrate, depositing a nanopatterned discontinuous excitation layer of material, in particular metal, preferably silver on the first transparent layer and depositing a second layer of a transparent, preferably dielectric material on the nanopatterned discontinuous excitation layer. A further dielectric cladding layer may be deposited on top as described. Accordingly the nanopatterned discontinuous excitation layer is encapsulated in at least two layers of transparent material. The nanopatterned discontinuous excitation layer is deposited in a plane being parallel to the surface of the waveguide. The nanopatterned discontinuous excitation layer is arranged in the node position(s) of one higher transverse mode (TEn or TMn, n=1).

According to the invention it is also possible to provide the light concentrator with a collecting thin film waveguide having several (at least two) parallel nanopatterned discontinuous excitation layers, the nanopatterned discontinuous excitation layers being spaced by a distance defined by the spacing of several (at least two) mode nodes to be excited. In such a case higher modes TEn, TMn with n>=2 may propagate in the collecting thin film waveguide. Accordingly such a collecting thin film waveguide comprises more than two transparent layers, each excitation layer being encapsulated between two respective transparent layers.

In a furthermore improved embodiment of the invention the light concentrator may comprise at least two stacked collecting thin film waveguides, in particular being attached to a common substrate. Each of these stacked collecting thin film waveguides may be fabricated according to the aforementioned method. A separating low refractive index buffer layer of transparent material may be arranged between each of the stacked collecting thin film waveguides.

As already mentioned a nanopatterned discontinuous excitation layer may be arranged in at least one distinct area of the light concentrator, this distinct area defining the collecting thin film waveguide in which a film mode is excited from the incident light. Particularly the discontinuous nanopattern may be arranged in several laterally spaced distinct collection areas of the light concentrator, thus forming several spaced collecting thin film waveguide arranged side by side.

A light concentrator according to the invention may comprise other areas that may contain waveguide structures for improved propagation, lateral concentration, distribution or extraction of optical power.

For instance a purely dielectric thin film waveguide without a nanopatterned non-planar excitation layer in the node position or any lateral patterns at all may show extremely low propagation losses. Hence it may connect collecting thin film waveguide of limited size in order to reduce the overall propagation losses of a light concentrator that is divided in collection and distribution and/or extraction areas.

In a similar way as in LSCs propagation losses are reduced by electrical wiring this new concept is termed optical wiring. In contrast to electrical wiring it connects collection areas on the same substrate, e.g. a foil, hence enabling large area efficient concentrators without additional costs.

The disadvantage of collecting light only in restricted collection areas of a light concentrator may be compensated by stacking collecting thin film waveguides in a way that a collecting thin film waveguide in one plane of the light concentrator is on top of a distributing waveguide structure in a second plane of the same light concentrator. Hence the entire area exposed to light can be used for collection and propagation losses can be reduced at the same time, particularly by optical wiring.

The extraction of light from the light concentrator may be realized in a direction deviating from the propagation direction, particularly perpendicular to the surface of the collecting thin film waveguide.

Such an extraction is possible, if a non-planar layer, particularly the nanopatterned discontinuous excitation layer used for collection is moved out or positioned out of the node-position of the guided mode.

The nanopattern of improved scattering, diffraction or other interaction with light is in this case not hidden in the node anymore but leads to extraction of light out of the light concentrator.

Moving the non-planar layer with respect to the node position may be realized by changing the material (dielectric constant) or thickness of one or both of the dielectric layers. For example the upper dielectric layer of a collecting thin film waveguide may be removed such changing the properties from collection to extraction. This approach will however lead to an increased local temperature at the extraction area.

A lateral extraction may use film or stripe waveguides ending in a certain direction. They may be tapered or forming a lens structures at the end. This extraction may also focus the guided optical power into an external hot-spot. This way the thermal impact on the substrate will be decreased compared to transverse extraction. This is useful, especially for flexible polymer substrates that cannot withstand large temperatures. The external hot-spot can also directly be used for energy converters, particularly as mentioned below. In addition light may be guided for lighting or heating applications into buildings by positioning an external extraction spot on the face of a specialized optical fiber, particularly a glass fiber, transporting the optical power into a building.

The definition and boundary of different waveguide structures of different function is preferably done by micropatterns.

These patterns define where the lower dielectric layer, the nanopatterned discontinuous excitation layer, and the upper dielectric layer are included and where single layers are removed. The micropatterns may have feature sizes bigger than microns, preferably bigger than tens of microns. Such micropatterns may comprise tapered or bent or stripe waveguide structures.

Accordingly and particularly by means of micropatterns a light concentrator may comprise several collecting thin film waveguides, in particular stripe-shaped collecting thin film waveguides being arranged parallel to each other and separated in a direction perpendicular to the lengthwise extension of each stripe that corresponds to the propagation direction of each stripe shaped collecting thin film waveguide and perpendicular to the normal vector of the surface of collection.

Due to their large feature size and in contrast to the nanopatterns the micropatterns can be defined with standard methods for patterning of thin films, in particular by deposition through shadow masks, photolithographic patterning and printing.

Micropatterns in the context of the invention are lateral patterns defining where the functional layers (bottom dielectric, discontinuous excitation layer, upper dielectric, capping) are placed. They may also define where a certain dielectric layer may be replaced by a dielectric layer of different refractive index or thickness or where a discontinuous excitation layer is replaced by a different kind of discontinuous excitation layer. The feature sizes of the micro-patterns are microns, preferably tens of microns.

In contrast to LCSs micro-patterned waveguides enable concentration beyond the mentioned first step of lateral wave excitation. The lateral modes can be guided, directed and concentrated within the plane, which is called planar concentration. The tapering of waveguides may be even beneficial beyond planar concentration.

In fact the definition of stripe shaped collecting thin film waveguides using micro-patterns enables the application of the explained node concept in a further dimension. For thin film waveguides confined one direction only a fix position of minimum intensity exists only in that direction. Higher stripe waveguide modes however form positions of minimum intensity in both directions of confinement. For instance in a fully symmetric stripe shaped collecting thin film waveguide (with respect to both directions of confinement) the intensity distribution of $HE_n$ or $EH_u$ stripe waveguide modes show a minimum intensity in the very center of the waveguide. A nanopatterned discontinuous stripe shaped excitation layer in the center of such a stripe shaped collecting thin film waveguide with respect to both directions of confinement may lead to very low propagation losses. When discontinuous in the remaining propagation direction the stripe shaped excitation layer may efficiently excite stripe modes that propagate in one defined direction only.

Furthermore, the micropatterns enable distinction between power collection, distribution and extraction that minimizes propagation losses similar to the electrical wiring of small LSCs. In contrast the new method termed optical wiring happens all optically on one substrate.

The micropatterns are clearly distinct from nanopatterns that are involved in the non-planar excitation layer, only.

The deposition of the transparent material may be done by atomic layer deposition, "ALD", known for the perfect control of layer thickness and low losses. Other methods such as thermal deposition, sputtering, sol-gel deposition or printing may also be used. The two layers of transparent and preferably dielectric material may each be deposited in a thickness of 200 to 400 nm, in particular having the same or at least similar thickness. In addition a capping layer of the same dielectric constant as the substrate may be deposited on top of the upper dielectric layer in order to improve the symmetry of the waveguide.

A method for fabricating the concentrator may provide that a nanopatterned discontinuous excitation layer is deposited as a discontinuous islandized film of material, preferably silver. This deposition may be realized by thermal evaporation, sputtering or electro-less deposition, for instance with the "mirror reaction". The silver island film is in that case directly deposited on top of the lower transparent, particularly dielectric layer. The deposition of a discontinuous layer may also be realized by deposition of nanoparticles from liquid suspensions, e.g. by printing, dip- or spin-coating.

In a preferred embodiment the nanopatterned discontinuous excitation layer is transferred to the lower dielectric layer by a nanotransfer-printing technique, in particular using a stamp or roll made of elastomeric material, preferably polydimethylsiloxane (PDMS). The stamp is formed by crosslinking of the elastomeric material on top of a nano relief pattern, particularly that was created for instance by electron beam lithography. The nano relief pattern may be expensive and limited in size. However the replicate stamps can be easily formed and many stamps can be combined to large area stamps which scales down production costs and allows to apply even sophisticated nanopatterns within the collection areas and implement many collection areas on large area scales using optical wiring.

Silver island films or continuous silver films are then deposited on top of such large area stamps containing nano relief patterns. The silver films are then transferred from the top areas of the stamp only which enables nano-patterning beyond self-organized silver island growth. Using this method a mass production of concentrators is possible, for example by roll-to-roll fabrication. In addition due to the very small thickness of the waveguide of preferably less than 1000 nm the waveguide may be flexible/bendable. This method may be used for printing islandized layers and also for continuous layers that form the nanopattern by their spacing between continuous layer areas.

A light concentrator in accordance with the invention may be used for collecting light, in particular sun light and concentrating the sun light to solar devices for converting solar power, in particular heat engines with electrical power generator or solar cells or solar-to-gas or solar-to-fuel generators or hybrid generators combining at least two of the afore-mentioned techniques.

SPECIFIC DESCRIPTION OF THE INVENTION

Figure 1:
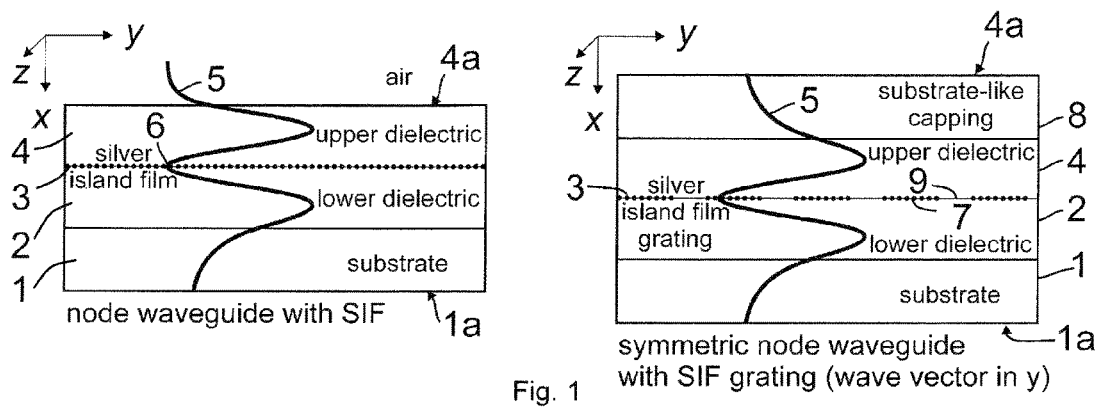
FIG. 1 diagrammatically shows embodiments of the invention.

FIG. 1 shows on the left a typical construction in a cross sectional view of a light concentrator according to the invention, the cross section being perpendicular to one lateral direction (z). The light concentrator comprises a lower substrate 1, particularly a foil, a layer of dielectric material 2 deposited on the substrate, a discontinuous excitation layer 3 deposited on the first dielectric layer 2 and a second dielectric layer 4 deposited on the layer 3. On the side opposite to the substrate 1 the dielectric layer 4 is contacted by air. Both dielectric layers 2 and 4 are formed with the same thickness thus leading to an asymmetric mode profile 5 since only the lower layer 2 is contacted by the additional substrate.

Light incident to the upper surface 4a of the second dielectric layer 4 or from the bottom 1a through the substrate 1 is coupled into the collecting thin film waveguide construction constituted by the three layers 2, 3, 4 and interacts with the nanopatterned discontinuous excitation layer 3 thus exciting a mode having an intensity profile parallel to the normal vector of the waveguide surface x and traveling in lateral direction, i.e. in y-direction. The excited mode, depicted by its intensity profile 5, has its minimum of intensity 6 exact in the position of the nanopatterned discontinuous excitation layer 3. This nanopatterned discontinuous excitation layer 3 is formed in the y-z-plane of the collecting thin film waveguide constituted by the deposited layer 2. In particular since a part of the mode is extending into the substrate 1 this substrate 1 may also be understood as a part of the collecting thin film waveguide. Hence even if the lower and upper dielectric layer 2,4 are identical the guided mode would still be slightly asymmetric as the substrate refractive index is larger compared to the refractive index of air.

In the example given in FIG. 1 a TEi-mode is excited and guided in the collecting thin film waveguide 2,3,4 of the light concentrator. Due to the position of the nanopatterned discontinuous excitation layer 3 in the node 6 of the excited mode the nanopattern of the excitation layer does scarcely interact with the TEi-mode. Accordingly this mode may travel in lateral y-direction (or any lateral direction in the plane yz) with minimum losses. Consequently light being trapped in the collecting thin film waveguide through the air/layer interface 4a of the upper dielectric layer 4 or through the substrate 1 may be guided in lateral direction and concentrated to a smaller extraction area, this extraction area being somewhere in the light concentrator in a lateral position not shown in the figure.

The typical TEi-mode intensity profile 5 shown in the FIG. 1 gives the intensity distribution of the mode as a function of the dimension x.

The nanopatterned discontinuous excitation layer 3 in the collecting thin film waveguide may comprise statistically distributed nanoscaled particles of material, preferably silver. For example it may be a silver island film (SIF).

FIG. 1 shows on the right an embodiment according to which the nanopatterned discontinuous excitation layer 3 is formed of a diffracting grating structure having periodically arranged structure elements 7. Each of the structure elements 7 may be formed by a silver island film or other discontinuous material or even by a continuous layer area since in such a case the nanoscaled spacing 9 between each two structure elements 7 breaks continuity as well.

In this embodiment furthermore the thickness of layer 2 and 4 encapsulating the nanopatterned discontinuous excitation layer 3 is the same and a capping 8 is chosen to have the same or at least similar refractive index as the index of the substrate thus forming a symmetric propagating mode 5. For best symmetry results the thickness of the capping 8 must also be large compared to the penetration depth of the evanescent field in that field that is shown by the exponential decay of the intensity profile 5.

Figure 2:
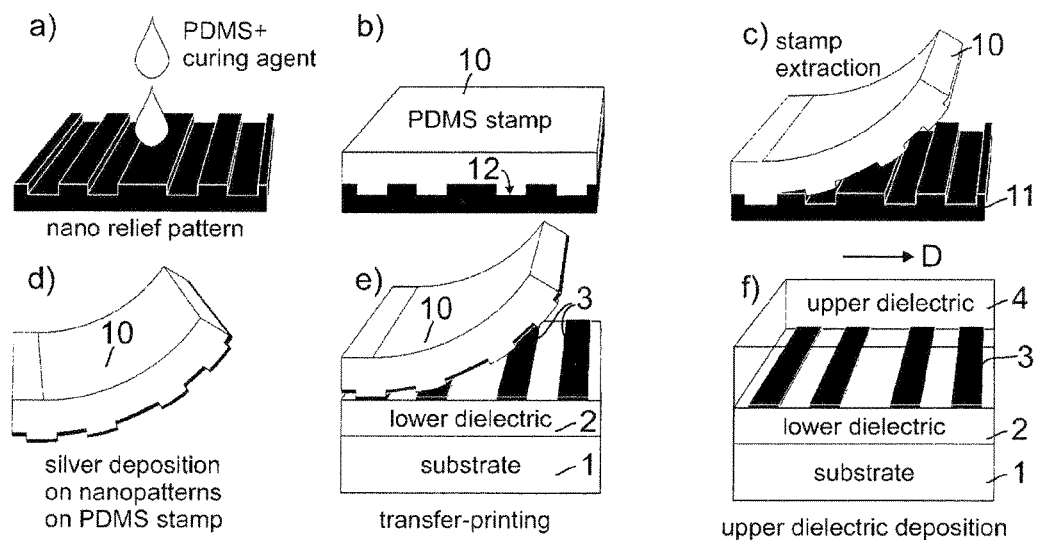
FIGS. 2a-2f are views illustrating steps for making this invention.

The embodiment of FIG. 2 shows how nanopatterns can be implemented in the discontinuous excitation layer 3. As shown in the upper part of FIG. 2 a stamp 10 may by replicated from a template containing a nano relief pattern 11 that for instance may be fabricated by electron beam lithography and etching. The stamp 10 may be formed of an elastic material which can easily be removed from the pattern template as shown in FIG. 2c. In FIG. 2d silver is deposited on the nano relief surface of the stamp and transfer-printed on top of the bottom dielectric layer 2 (FIG. 2e). Each line of the nano pattern 12 is thus transferred to the transparent layer 2 and forms an island film of silver or a continuous silver film being spaced according to the nano template. In this construction the guided mode is excited in a preferred direction D defined by the direction of nano patterning, particularly the nano patterning being provided with one or more periodicities.

Figure 3:
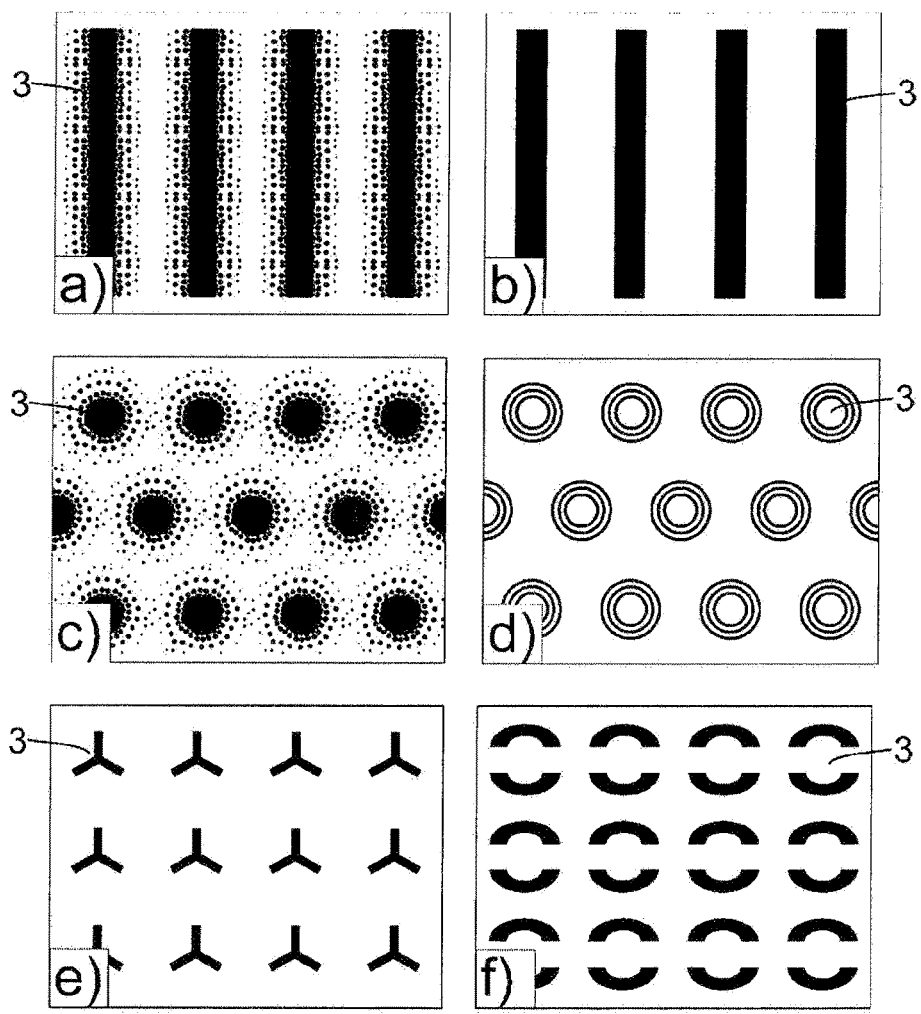
FIGS. 3a-3g illustrate nanopatterns and SEM image of the invention.
Figure 3:
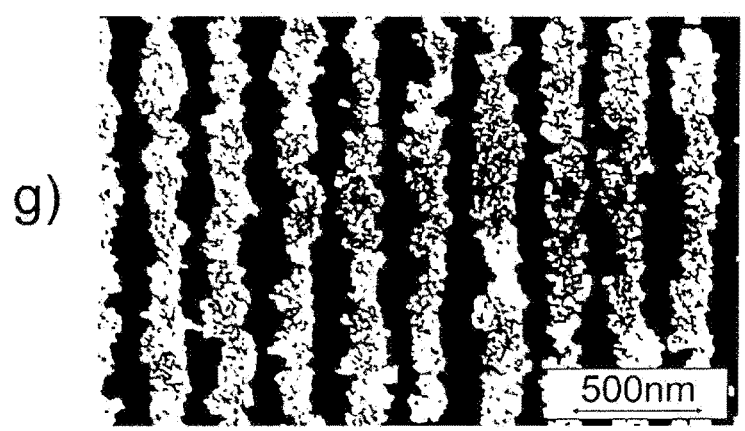

FIGS. 3a to 3f furthermore show, that a nano structure does not necessarily consist of a line structure only as shown in a) but may also have a patterning in two dimensions. Each nano element 12 may comprise a rotation symmetric pattern or a periodic or nonperiodic repetition in both dimensions and may be formed of islandized areas (FIG. 3a,c,g) as well as of continuous areas (FIG. 3b,d-f).

FIG. 3g shows a top view of a real grating structure that was transfer printed and comprises grating lines each being formed of islandized material.

Figure 4:
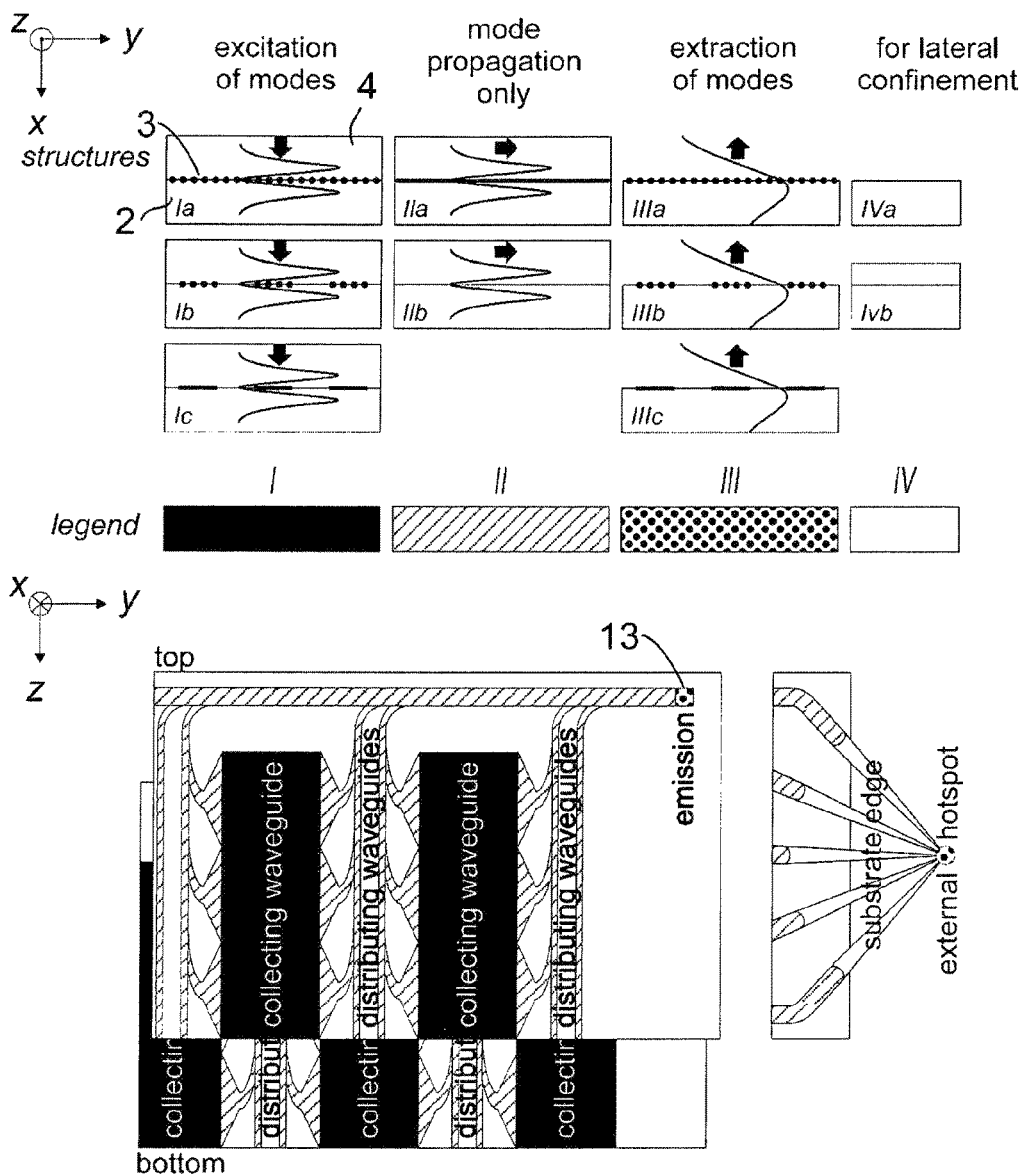
FIG. 4 shows different waveguide structures according to the invention.

FIG. 4 shows in the top part that different waveguide structures I, II, III, IV may be established in a light concentrator according to the invention in a lateral arrangement. Here the structure I constitutes a waveguide for excitation of film modes, a collecting thin film waveguide 2,3,4 as shown in FIG. 1. According to 1a the nanopatterned discontinuous excitation layer 3 may be an islandized layer having no further structure. According to 1b the nanopatterned discontinuous excitation layer 3 may have a superimposed nanopattern, each pattern element being islandized. According to 1c the nanopatterned discontinuous excitation layer 3 is formed of spaced continuous areas.

In the waveguide structure II no discontinues excitation layer at all exist. The excited mode is propagating undisturbed.

In the waveguide structure III extraction of the light takes place. Here this is done by removing the top layer 4 of a colleting thin film waveguide 2,3,4

The waveguide structure IV is used for lateral confinement.

The lower part of FIG. 4 shows that a light concentrator of the invention may consist of different waveguide structures being stacked on each other. Here the waveguide structures are stacked in two planes, each plane at least comprising a collecting thin film waveguide and waveguide structures for distribution of light in a side-by-side configuration. It makes use of the legend to correlate the certain areas to the waveguide structures above. The different areas, particularly areas for collection and distribution may be offset in the two planes of such a stacked light concentrator. Distribution areas may guide the collected light to a common spot of extraction 13. As a second way for extraction an external hotspot is shown. It is also symbolized by the dotted pattern for an extraction structure although this is here just symbolizing the extraction as no waveguide is included in this position.

Figure 5:
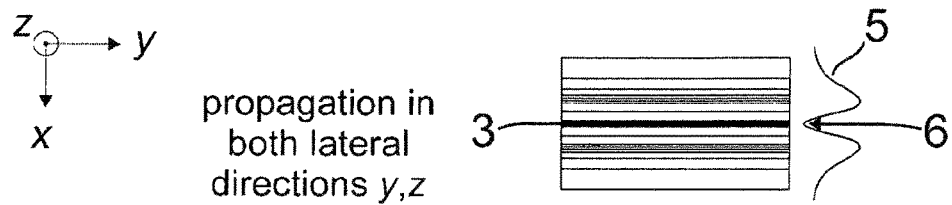
FIGS. 5a-5c show different types of thin-film waveguides.
Figure 5:
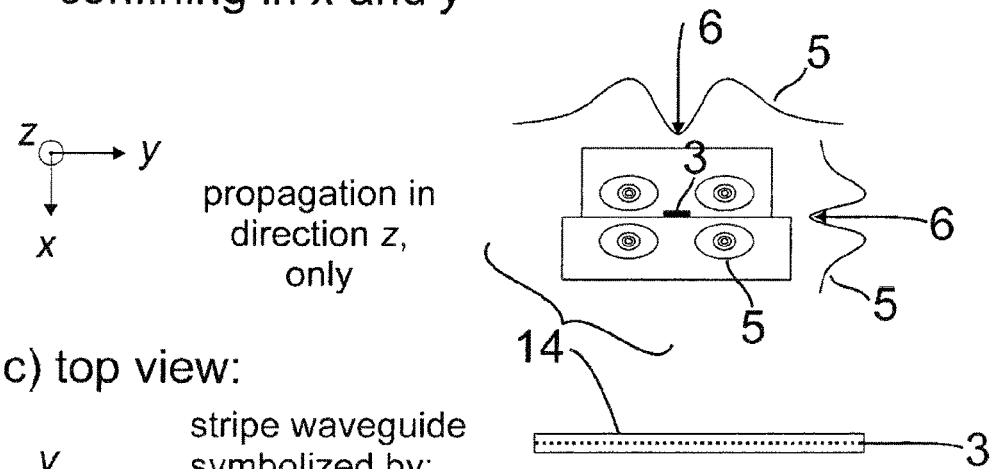
Figure 5:
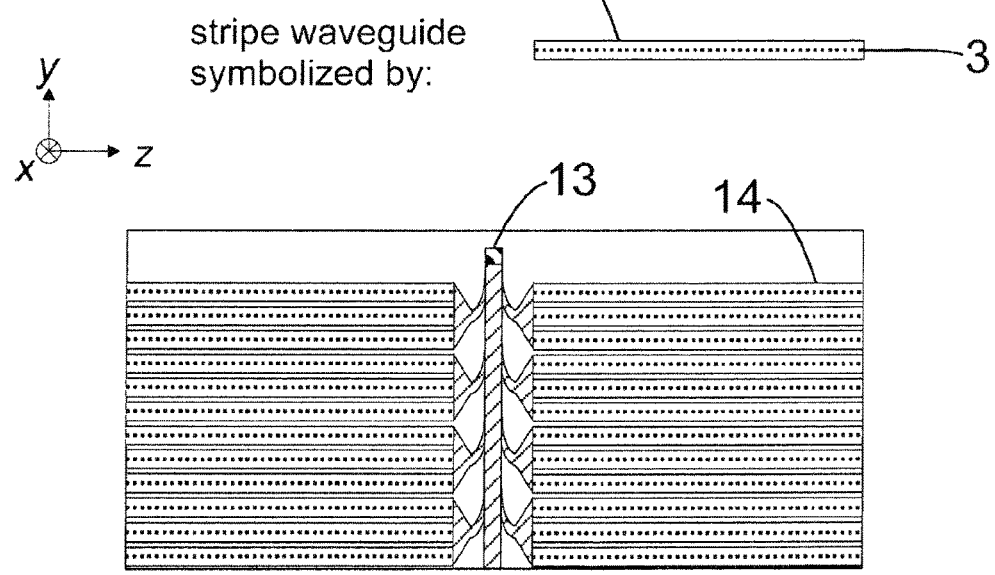

FIG. 5 shows how the concept of the invention may be applied to a second dimension. FIG. 5a shows a collecting thin film waveguide where the mode is confined in x direction only. A fix position of minimum intensity hence exists in x direction only. The wave freely propagates in y and z.

When confining the wave in a second dimension (y) according to FIG. 5b a stripe shaped collecting thin film waveguide is build. Higher stripe waveguide modes show minimum intensity position with respect to x and y. For instance in a fully symmetric stripe shaped collecting thin film waveguide (with respect to x and y) the intensity distribution 5 of dielectric HE-n or EHu stripe waveguide modes has a minimum intensity in the very center of the waveguide and hence a minimum in x and y.

As the concept of node modes adapted to one dimension has successfully reduced waveguide losses it is assumed that adapting the concept to a further dimension leads to further improvement of propagation losses for stripe modes propagating in z direction. A stripe shaped nanopatterned discontinuous excitation layer 3 in the center of such a stripe shaped collecting thin film waveguide 4 with respect to x and y that is discontinuous with respect to the propagation direction z may excite such stripe modes of very low propagation losses. A possible implementation of such light concentrators having stripe shaped collecting thin film waveguides on large areas is shown in FIG. 5c.

The invention claimed is:

1. A method of concentrating light by coupling light into a thin film waveguide arranged on a substrate via at least one of its parallel surfaces, the method comprising the step of exciting in the thin-film-waveguide at least one lateral guided mode having a node by scattering, diffraction or surface plasmon excitation of the incident light at a nanopatterned discontinuous excitation layer, the nanopatterned discontinuous excitation layer being in the thin-film-waveguide at a position of the node of the guided lateral mode.

2. The method according to claim 1, wherein the exciting of the light of the at least one guided mode is effected in at least one specific lateral direction by providing a nanopatterned discontinuous excitation layer with a scattering or diffracting structure.

3. A light concentrator comprising:
   a thin film waveguide deposited on a substrate and having at least two parallel surfaces; and
   means for coupling light into the thin film waveguide via at least one of the se surfaces, the thin film waveguide being a collecting thin-film waveguide for collecting light having a nanopatterned discontinuous excitation layer at a position corresponding to a node position of a guided mode to be excited in the collecting thin film waveguide.

4. The light concentrator according to claim 3, wherein the nanopatterned discontinuous excitation layer lies in a plane parallel to the surfaces and has a thickness of 20 nm or less in a direction normal to the plane.

5. The light concentrator according to claim 3, wherein the nanopatterned discontinuous excitation layer is formed of a silver island film having a mass thickness of 5 to 15 nm or particle size of 10 to 100 nm or nanoparticles being deposited from liquid suspension, by printing, dip- or spin-coating.

6. The light concentrator according to claim 3, wherein the nanopatterned discontinuous excitation layer is between two layers of transparent dielectric material.

7. The light concentrator according to claim 3, wherein the nanopatterned discontinuous excitation layer comprises or is formed of at least one scattering or diffracting structure extending parallel to the surface.

8. The light concentrator according to claim 3, wherein the substrate is formed of a flexible foil to which the collecting thin film waveguide is attached by material deposition.

9. The light concentrator according to claim 3, further comprising:
at least two stacked collecting thin-film-waveguides attached to a common substrate.

10. Use of a concentrator according to claim 3 for collecting sun light, and concentrating the light to heat engines with electrical power generator or solar cells or solar-to-gas or solar-to-fuel generators.

11. The method defined in claim 7, wherein the scattering or diffracting structure extending comprises or is formed of at least one grating structure having at least one periodicity in a direction parallel to the surface.

12. A light concentrator comprising:
a thin film waveguide deposited on a substrate and having at least two parallel surfaces;
means for coupling light into the thin film waveguide via at least one of these surfaces, the thin film waveguide being a collecting thin film waveguide for collecting light having a nanopatterned discontinuous excitation layer at a position corresponding to a node position of a guided mode to be excited in the collecting thin film waveguide;
several collecting thin film waveguides spaced in the same plane in a propagation direction; and
waveguides for distribution or extraction of light between the collecting thin film waveguides and comprising tapered or bent or stripe waveguide structures.

13. The light concentrator according to claim 12, further comprising:
several stripe shaped collecting thin film waveguides parallel to each other on the substrate and each having a stripe shaped discontinuous excitation layer extending and discontinuous in the propagation direction and arranged in the node of the excited mode with respect to both transverse directions.

14. A method of fabricating a light concentrator, the method comprising the steps of:
depositing a first layer of a transparent dielectric material on a substrate;
depositing a nanopatterned discontinuous excitation layer of metal on the first layer; and
depositing a second layer of a transparent dielectric material on the nanopatterned discontinuous excitation layer, the first and second transparent layers each being deposited in a thickness of 200 nm to 400 nm.

15. The method according to claim 14, further comprising the step of:
depositing the nanopatterned discontinuous excitation layer as a discontinuous islandized film/layer of silver or as printed, dip- or spin-coated nanoparticles.

16. A method of fabricating a light concentrator, the method comprising the steps of:
depositing a first layer of a transparent dielectric material on a substrate;
depositing a nanopatterned discontinuous excitation layer of metal on the first layer;
depositing a second layer of a transparent dielectric material on the nanopatterned discontinuous excitation layer, the first and second transparent layers each being deposited in a thickness of 200 nm to 400 nm; and
transferring the nanopatterned discontinuous excitation layer to the first layer by transfer-printing using a stamp or roll made of elastomeric material and having a nano relief.

* * * * *